United States Patent
Choi et al.

(10) Patent No.: US 10,136,524 B2
(45) Date of Patent: Nov. 20, 2018

(54) SLIDING DISPLAY DEVICE

(71) Applicant: SAMSUNG DISPLAY CO., LTD., Yongin-si, Gyeonggi-do (KR)

(72) Inventors: Jin-Hwan Choi, Seoul (KR); Jeong-Ho Kim, Seoul (KR); Tae-An Seo, Hwaseong-si (KR); Jung-Hun Lee, Hwaseong-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/659,911

(22) Filed: Jul. 26, 2017

(65) Prior Publication Data
US 2018/0049328 A1 Feb. 15, 2018

(30) Foreign Application Priority Data
Aug. 11, 2016 (KR) .................. 10-2016-0102402

(51) Int. Cl.
*G06F 1/16* (2006.01)
*H05K 5/00* (2006.01)
(Continued)

(52) U.S. Cl.
CPC ......... *H05K 5/0017* (2013.01); *G06F 1/1601* (2013.01); *G06F 1/1624* (2013.01); *G06F 1/1626* (2013.01); *G06F 1/1652* (2013.01); *H04M 1/0235* (2013.01); *H04M 1/0268* (2013.01); *H05K 5/0217* (2013.01); *G02F 1/133305* (2013.01); *G02F 1/133308* (2013.01); *G06F 2203/04102* (2013.01);
(Continued)

(58) Field of Classification Search
CPC .. H05K 5/0017; H05K 5/0217; G06F 1/1624; G06F 1/1626; G06F 1/1652; H04M 1/0235
See application file for complete search history.

(56) References Cited

U.S. PATENT DOCUMENTS 9,772,657 B2 * 9/2017 Takayanagi ........... G06F 1/1652
2005/0041012 A1 * 2/2005 Daniel .................. G06F 1/1601
345/156
(Continued)

FOREIGN PATENT DOCUMENTS

EP 2469808 A2 6/2012
WO WO 2016/018300 A1 2/2016

OTHER PUBLICATIONS

European Office Action dated Dec. 21, 2017 from the European Patent Office for Patent Application No. 17185554.7.

*Primary Examiner* — Hoa C Nguyen
*Assistant Examiner* — Keith Depew
(74) *Attorney, Agent, or Firm* — Lee & Morse, P.C.

(57) ABSTRACT

A sliding display device includes a housing, a flexible display panel, a first roller, and a second roller. The housing includes a display region between a first edge region and a second edge region. The distance between the first and second edge regions changes as the housing is expanded and contracted. The flexible display panel slides into and out from the housing through the first and second edge regions as the housing expands and contracts. The first and second rollers guide panel regions into and out of empty spaces in the housing. An assistant roller assists in moving one of the panel regions along a non-intersecting path.

20 Claims, 9 Drawing Sheets

(51) Int. Cl.
*H05K 5/02* (2006.01)
*H04M 1/02* (2006.01)
G02F 1/1333 (2006.01)
H01L 27/32 (2006.01)
H01L 51/52 (2006.01)

(52) U.S. Cl.
CPC ....... *H01L 27/3211* (2013.01); *H01L 27/3244* (2013.01); *H01L 51/524* (2013.01); *H01L 2251/5338* (2013.01)

(56) References Cited

U.S. PATENT DOCUMENTS

| | | | |
|---|---|---|---|
| 2006/0007368 A1* | 1/2006 | Slikkerveer | G09F 9/35 349/58 |
| 2006/0176243 A1* | 8/2006 | Yeh | G06F 1/1624 345/30 |
| 2007/0146243 A1* | 6/2007 | Ou Yang | G06F 1/1601 345/76 |
| 2013/0058063 A1* | 3/2013 | O'Brien | G06F 1/1624 361/807 |
| 2016/0034000 A1* | 2/2016 | Lee | G06F 1/1652 361/749 |
| 2016/0100478 A1* | 4/2016 | Lee | H04M 1/0202 361/749 |
| 2016/0320804 A1* | 11/2016 | Takayanagi | G06F 1/1615 |
| 2017/0023978 A1* | 1/2017 | Cho | H04M 1/0268 |
| 2017/0212556 A1* | 7/2017 | Jovanovic | G06F 1/1652 |
| 2018/0098440 A1* | 4/2018 | Choi | H05K 5/0017 |
| 2018/0103550 A1* | 4/2018 | Seo | H01F 7/0205 |
| 2018/0103552 A1* | 4/2018 | Seo | H05K 5/0017 |

* cited by examiner

SLIDING DISPLAY DEVICE

CROSS-REFERENCE TO RELATED APPLICATION

Korean Patent Application No. 10-2016-0102402, filed on Aug. 11, 2016, and entitled, "Sliding Display Device," is incorporated by reference herein in its entirety.

BACKGROUND

1. Field

One or more embodiments described herein relate to a sliding display device.

2. Description of the Related Art

The demand for portable electronic devices that display large-size images is increasing. A sliding display has been proposed in an attempt to satisfy this demand. Such a display includes a flexible display panel that slides into and out of a housing to respectively display small- and large-size images. However, such as display device has drawbacks, not the least of which includes an inefficient use of empty space in the housing when the flexible panel is inside the housing.

SUMMARY

In accordance with one or more embodiments, a sliding display device including a housing including a display region between a first edge region and a second edge region, a distance between the first edge region and the second edge region to change as the housing is expanded or contracted in a first direction and a second direction opposite to the first direction; a flexible display panel to slide out from the housing through the first and second edge regions as the housing is expanded and to slide into the housing through the first and second edge regions as the housing is contracted; a first main roller to guide a first panel region of the flexible display panel, that is slid into the housing through the first edge region, into an empty space of the housing and to allow the first panel region of the flexible display panel to move along a first moving path in the empty space of the housing; a second main roller to guide a second panel region of the flexible display panel, that is slid into the housing through the second edge region, into the empty space of the housing, a radius of rotation of the second main roller equal to a radius of rotation of the first main roller; and an assistant roller to assist the second main roller to allow the second panel region of the flexible display panel to move along a second moving path not intersecting the first moving path in the empty space of the housing.

The assistant roller may be separate from the second main roller. A radius of rotation of the assistant roller is different from the radius of rotation of the second main roller. A radius of rotation of the assistant roller may be equal to the radius of rotation of the second main roller.

In accordance with one or more other embodiments, a sliding display device includes a housing including a display region between a first edge region and a second edge region, a distance between the first edge region and the second edge region to change as the housing is expanded or contracted in a first direction and a second direction opposite to the first direction; a flexible display panel to slide out from the housing through the first and second edge regions as the housing is expanded and to slide into the housing through the first and second edge regions as the housing is contracted; a first main roller to guide a first panel region of the flexible display panel, that is slid into the housing through the first edge region, into an empty space of the housing; a first assistant roller to assist the first main roller to allow the first panel region of the flexible display panel to move along a first moving path in the empty space of the housing; a second main roller to guide a second panel region of the flexible display panel, that is slid into the housing through the second edge region, into the empty space of the housing, a radius of rotation of the second main roller equal to a radius of rotation of the first main roller; and a second assistant roller to assist the second main roller to allow the second panel region of the flexible display panel to move along a second moving path that does not intersect the first moving path in the empty space of the housing.

The first assistant roller may be separate from the first main roller. The second assistant roller may be separate from the second main roller. A radius of rotation of the first assistant roller may be different from the radius of rotation of the first main roller, and a radius of rotation of the second assistant roller may be different from the radius of rotation of the second main roller. The radius of rotation of the first assistant roller may be different from the radius of rotation of the second assistant roller. The radius of rotation of the first assistant roller may be equal to the radius of rotation of the second assistant roller.

In accordance with one or more other embodiments, a sliding display device includes a housing including a display region between a first edge region and a second edge region, a distance between the first edge region and the second edge region to change as the housing is expanded or contracted in a first direction and a second direction opposite to the first direction; a flexible display panel to slide out from the housing through the first and second edge regions as the housing is expanded and to slide into the housing through the first and second edge regions as the housing is contracted; a first main roller to guide a first panel region of the flexible display panel, that is slid into the housing through the first edge region, into an empty space of the housing, and to allow the first panel region of the flexible display panel to move along a first moving path in the empty space of the housing; a second main roller to guide a second panel region of the flexible display panel, that is slid into the housing through the second edge region, into the empty space of the housing, a radius of rotation of the second main roller equal to a radius of rotation of the first main roller; and a support beam to support the second panel region of the flexible display panel to allow the second panel region of the flexible display panel to move along a second moving path that does not intersect the first moving path in the empty space of the housing. The support beam may have a cylindrical shape. The support beam may be separate from the second main roller.

In accordance with one or more other embodiments, a sliding display device includes a housing including a display region between a first edge region and a second edge region, a distance between the first edge region and the second edge region to change as the housing is expanded or contracted in a first direction and a second direction opposite to the first direction; a flexible display panel to be slide out from the housing through the first and second edge regions as the housing is expanded and to slide into the housing through the first and second edge regions as the housing is contracted; a first main roller to guide a first panel region of the flexible display panel, that is slid into the housing through the first edge region, into an empty space of the housing; a first support beam to support the first panel region of the flexible display panel to allow the first panel region of the flexible display panel to move along a first moving path in the empty space of the housing; a second main roller to guide a second panel region of the flexible display panel, that is slid into the housing through the second edge region, into the empty space of the housing, a radius of rotation of the second main roller equal to a radius of rotation of the first main roller; and a second support beam to support the second panel region of the flexible display panel to allow the second panel region of the flexible display panel to move along a second moving path that does not intersect the first moving path in the empty space of the housing. Each of the first support beam and the second support beam may have a cylindrical shape. The first support beam may be separate from the first main roller. The second support beam may be separate from the second main roller.

In accordance with one or more other embodiments, a sliding display device includes a housing including a display region between a first edge region and a second edge region, a distance between the first edge region and the second edge region to change as the housing is expanded or contracted in a first direction and a second direction opposite to the first direction; a flexible display panel to slide out from the housing through the first and second edge regions as the housing is expanded and to slide into the housing through the first and second edge regions as the housing is contracted; a first support beam to guide a first panel region of the flexible display panel, that is slid into the housing through the first edge region, into an empty space of the housing and to support the first panel region of the flexible display panel to allow the first panel region of the flexible display panel to move along a first moving path in the empty space of the housing, the first support beam having a cylindrical shape with a radius of curvature; and a second support beam to guide a second panel region of the flexible display panel, that is slid into the housing through the second edge region, into the empty space of the housing and to support the second panel region of the flexible display panel to allow the second panel region of the flexible display panel to move along a second moving path that does not intersect the first moving path in the empty space of the housing, the second support beam having a cylindrical shape with a first radius of curvature in a front direction of the housing and a second radius of curvature in a back direction of the housing, wherein the radius of curvature of the first support beam is equal to the first radius of curvature of the second support beam, and the first radius of curvature of the second support beam is different from the second radius of curvature of the second support beam. The first radius of curvature of the second support beam may be greater than the second radius of curvature of the second support beam. The first radius of curvature of the second support beam may be less than the second radius of curvature of the second support beam.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
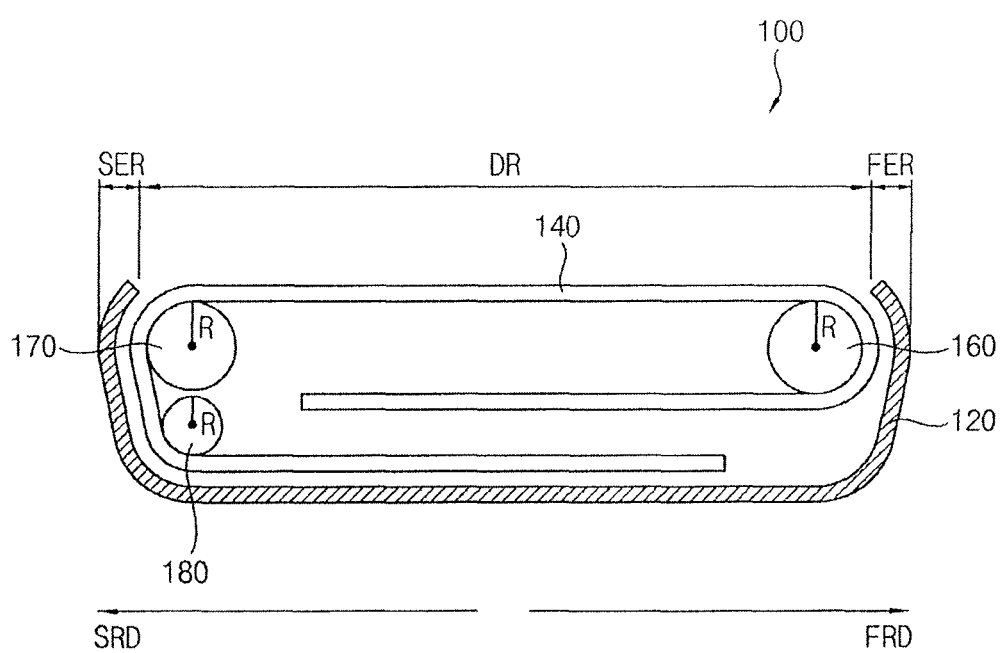
FIG. 1 illustrates an embodiment of a sliding display device.

Example embodiments will be described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, it will also be understood that when a layer or element is referred to as being "on" another layer or substrate, it can be directly on the other layer or substrate, or intervening layers may also be present. Further, it will be understood that when a layer is referred to as being "under" another layer, it can be directly under and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
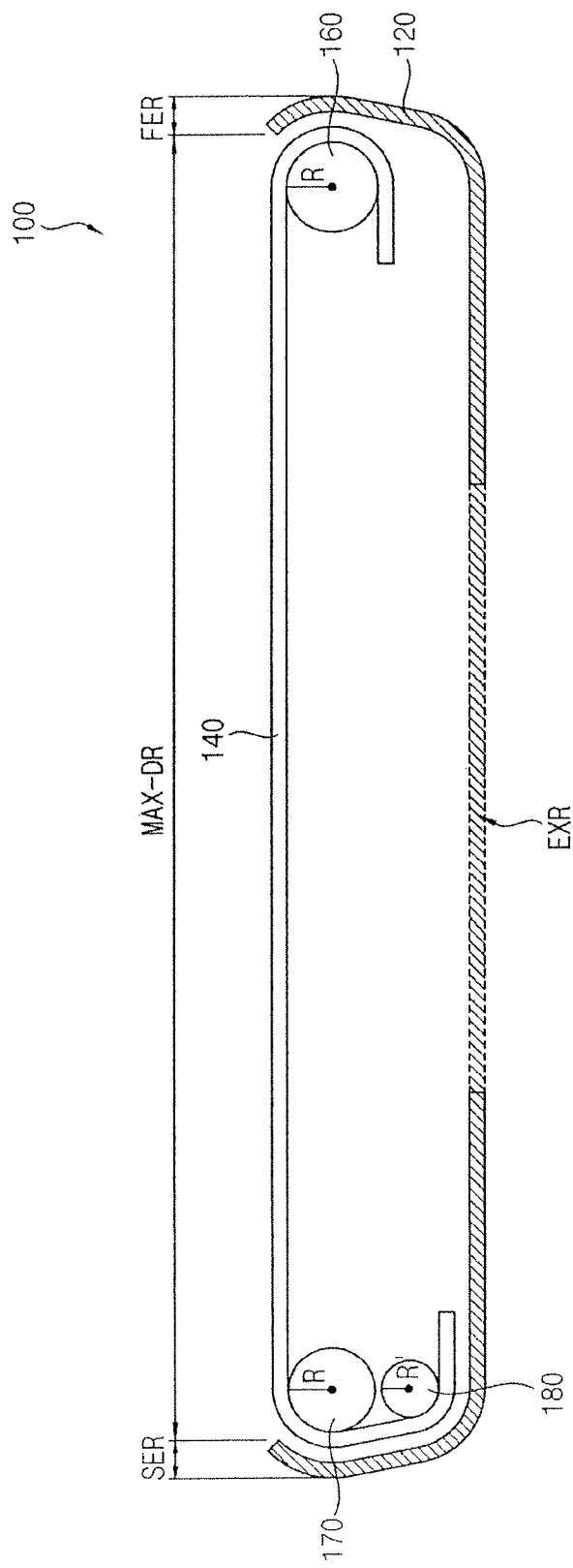
FIG. 2 illustrates an embodiment of a display region in an expanded position.
Figure 3A:
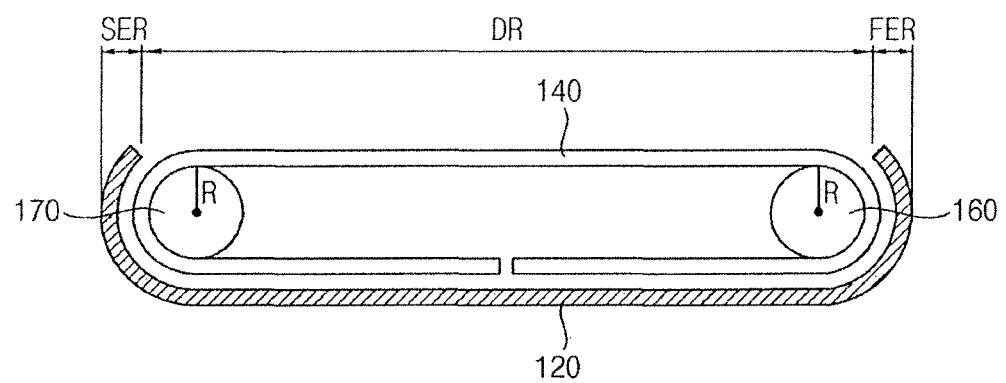
FIG. 3A illustrates one type of sliding display device that has been proposed.
Figure 3B:
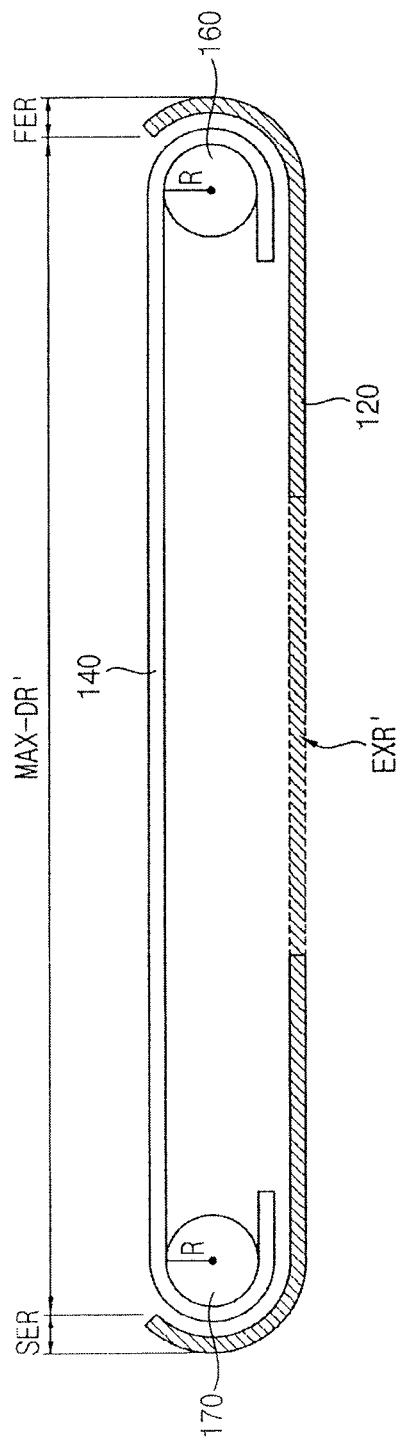
FIG. 3B illustrates a display region of the sliding display device in FIG. 3A in an expanded position.

FIG. 1 is a cross-sectional diagram of an embodiment of a sliding display device 100. FIG. 2 is a cross-sectional diagram of an embodiment of an expanded state of a display region of the sliding display device in FIG. 1. FIG. 3A is a cross-sectional diagram of one type of proposed sliding display device having a two-way sliding structure without an assistant roller, and FIG. 3B is a cross-sectional diagram of the display region in FIG. 3A in expanded an expanded position.

Referring to FIGS. 1-3B, the sliding display device 100 may include a housing 120, a flexible display panel 140, a first main roller 160, a second main roller 170, and an assistant roller 180. The sliding display device 100 may include a driving integrated circuit that drives the flexible display panel 140, a power supply circuit that supplies driving power to the flexible display panel 140, etc., in the housing 120.

The housing 120 may include a display region DR between a first edge region FER and a second edge region SER. The flexible display panel 140 may be exposed to a user (e.g., viewer) through the display region DR in a front direction of the housing 120. Thus, the sliding display device 100 may display an image on the flexible display panel 140 corresponding to the display region DR. In example embodiments, the distance between the first edge region FER and the second edge region SER may change as the housing 120 is expanded or contracted in a first direction FRD and a second direction SRD opposite to the first direction FRD.

In one embodiment, the size of the display region DR is proportional to the distance between the first edge region FER and the second edge region SER. The size of the display region DR may therefore be increased or decreased as the housing 120 is expanded or contracted in the first direction FRD and the second direction SRD.

In an example embodiment, the first edge region FER may be a top edge region (or, a bottom edge region) of the housing 120, and the second edge region SER may be the bottom edge region (or, the top edge region) of the housing 120, when the housing 120 is expanded or contracted in a top-bottom direction.

In another example embodiment, the first edge region FER may be a right edge region (or, a left edge region) of the housing 120, and the second edge region SER may be the left edge region (or, the right edge region) of the housing 120, when the housing 120 is expanded or contracted in a left-right direction.

The flexible display panel 140 may slide out from the housing 120 through the first and second edge regions FER and SER when the housing 120 is expanded in the first direction FRD and the second direction SRD. The flexible display panel 140 may slide into the housing 120 through the first and second edge regions FER and SER when the housing 120 is contracted in the first direction FRD and the second direction SRD. Because the flexible display panel 140 is manufactured with flexible materials, the flexible display panel 140 may be guided into an empty space of the housing 120 by the first main roller 160, the second main roller 170, and the assistant roller 180 after being slid into the housing 120. The housing 120 may include various shapes of path-structures to allow the flexible display panel 140 to slide into and out of the housing 120.

For example, in FIG. 2, when the housing 120 is expanded to the maximum extent in the first direction FRD and the second direction SRD (e.g., indicated by EXR), an exposed area of the flexible display panel 140 (e.g., display region DR) may be exposed to the maximum extent (e.g., indicated by MAX-DR). For example, as the housing 120 is expanded in the first direction FRD and the second direction SRD, the flexible display panel 140 may slide out from the housing 120 through the first and second edge regions FER and SER. As the housing 120 contracts in the first direction FRD and the second direction SRD, the flexible display panel 140 may slide into the housing 120 through the first and second edge regions FER and SER. An expanded state of the housing 120 in the first direction FRD and the second direction SRD is conceptually illustrated in FIG. 2.

In one embodiment, the housing 120 may be manufactured with stretchable materials that expand and/or contract in the first direction FRD and the second direction SRD. In another embodiment, the housing 120 may include a mechanical structure (e.g., a spring structure, etc.) that expands and/or contracts in the first direction FRD and the second direction SRD.

The flexible display panel 140 may include a plurality of pixels. In an example embodiment, the pixels may include red color (R) displaying pixels, green color (G) displaying pixels, and blue color (B) displaying pixels. In another example embodiment, the pixels may include red color (R) displaying pixels, green color (G) displaying pixels, blue color (B) displaying pixels, and white color (W) displaying pixels. The flexible display panel 140 may be driven by the driving integrated circuit to display (or, output) an image using the pixels. The driving integrated circuit may include, for example, a scan driver, a data driver, a timing controller, etc. In an example embodiment, the flexible display panel 140 may be an organic light emitting display (OLED) panel with organic light emitting diodes. In another example embodiment, the flexible display panel 140 may be a liquid crystal display (LCD) panel that includes liquid crystals. The flexible display panel 140 may be a different type of panel in another embodiment.

The first main roller 160 may guide a first panel region of the flexible display panel 140 that slides into the housing 120 through the first edge region FER and into an empty space of the housing 120. The first main roller 160 may allow the first panel region of the flexible display panel 140 to move along a first moving path in the empty space of the housing 120. For example, as illustrated in FIG. 1, the first moving path may be a path corresponding to the second direction SRD from the first edge region FER to the second edge region SER.

The second main roller 170 may allow a second panel region of the flexible display panel 140 to slide into the housing 120 through the second edge region SER and into the empty space of the housing 120. The radius of rotation R of the second main roller 170 may be equal to a radius of rotation R of the first main roller 160 or may be different. When the radius of rotation R of the second main roller 170 is equal to the radius of rotation R of the first main roller 160, a user may perceive that the display region DR adjacent to the first edge region FER and the display region DR adjacent to the second edge region SER are symmetrical.

The assistant roller 180 may assist the second main roller 170 in moving the second panel region of the flexible display panel 140 along a second moving path, which does not intersect the first moving path, in the empty space of the housing 120. For example, in FIG. 1, the second moving path may extend from the second edge region SER to the first edge region FER in the first direction FRD. In an example embodiment, the assistant roller 180 may be apart from the second main roller 170.

In some example embodiments, the radius of rotation R' of the assistant roller 180 may be different from the radius of rotation R of the second main roller 170. The assistant roller 180 may prevent the second panel region of the flexible display panel 140 from colliding with the first panel region of the flexible display panel 140 (e.g., may prevent the second moving path of the second panel region of the flexible display panel 140 from intersecting the first moving path of the first panel region of the flexible display panel 140). The radius of rotation R' of the assistant roller 180 may therefore be relatively small relative to the thickness of the sliding display device 100. Thus, in one embodiment, as illustrated in FIG. 1, the radius of rotation R' of the assistant roller 180 may be less than the radius of rotation R of the second main roller 170. In some example embodiments, the radius of rotation R' of the assistant roller 180 may be equal to or greater than the radius of rotation R of the second main roller 170.

Referring to FIGS. 3A and 3B, the proposed sliding display device has a two-way sliding structure without assistant roller 180. A first moving path of the first panel region of the flexible display panel 140 may be the same as (or intersect) a second moving path of the second panel region of the flexible display panel 140. The first moving path is determined by the first main controller 160 and the second moving path is determined by the second main roller 170. The second main roller 170 may have a radius of rotation R equal to the radius of rotation R of the first main roller 160. Thus, as illustrated in FIG. 3A, the size of the flexible display panel 140 may be determined to allow the first panel region of the flexible display panel 140 to slide into the housing 120 through the first edge region FER without colliding with the second panel region of the flexible display panel 140, that slides into the housing 120 through the second edge region SER.

As a result, as illustrated in FIG. 3B, an exposed area of the flexible display panel 140 (i.e., the display region DR) of the proposed sliding display device may be smaller that an exposed area of the flexible display panel 140 of the sliding display device 100 including assistant roller 180, when the exposed area of the flexible display panel 140 is expanded to the maximum extent (e.g., MAX-DR') as the housing 120 is expanded to the maximum extent in the first direction FRD and the second direction SRD (e.g., EXR').

If the proposed sliding display device achieves a maximum size of the flexible display panel 140, by including the first and second main rollers 160 and 170 with different radiuses of rotation, a user may perceive the display region DR adjacent to the first edge region FER and the display region DR adjacent to the second edge region SER to be asymmetrical.

To overcome this problem, the sliding display device 100 of the present embodiment may have a two-way sliding structure, in which the flexible display panel 140 slides into the housing 120 through the first and second edge regions FER and SER of the housing 120, and then is guided into the empty space of the housing 120. The sliding display device 100 includes the first main roller 160 that allows the first panel region of the flexible display panel 140 to slide into the housing 120 through the first edge region FER along the first moving path in the empty space of the housing 120. The second main roller 170 and the assistant roller 180 allow the second panel region of the flexible display panel 140 to slide into the housing 120 through the second edge region SER along the second moving path, which does not intersect the first moving path, in the empty space of the housing 120.

As a result, the sliding display device 100 may achieve an increased or maximum size of the flexible display panel 140 by using the empty space of the housing 120 to an increased or maximum extent, and therefore may allow a user to perceive that the display region DR adjacent to the first edge region FER and the display region DR adjacent to the second edge region SER are symmetrical. In the present embodiment, one assistant roller 180 is used to assist the second main roller 170. In some example embodiments, two or more assistant rollers 180 may be included to assist the second main roller 170.

Figure 4A:
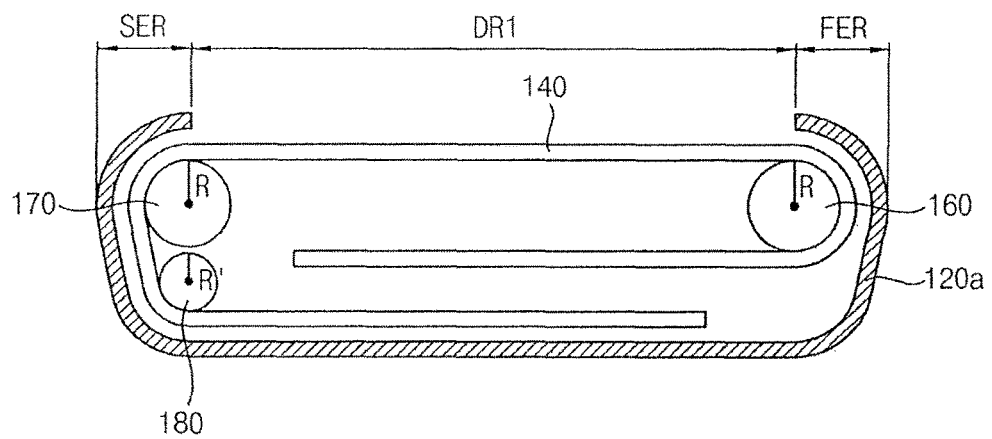
FIGS. 4A-4C illustrate various embodiments of an edge region of a housing of the sliding display device in FIG. 1.
Figure 4B:
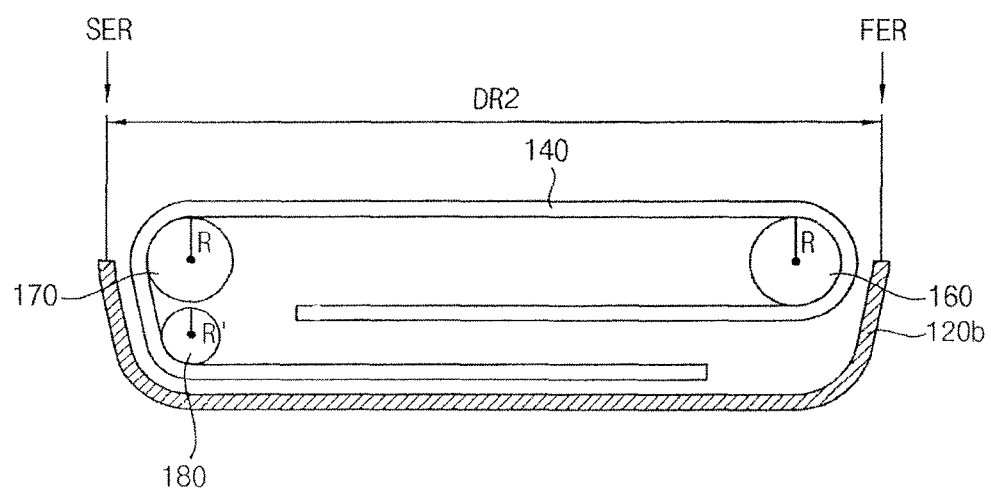
Figure 4C:
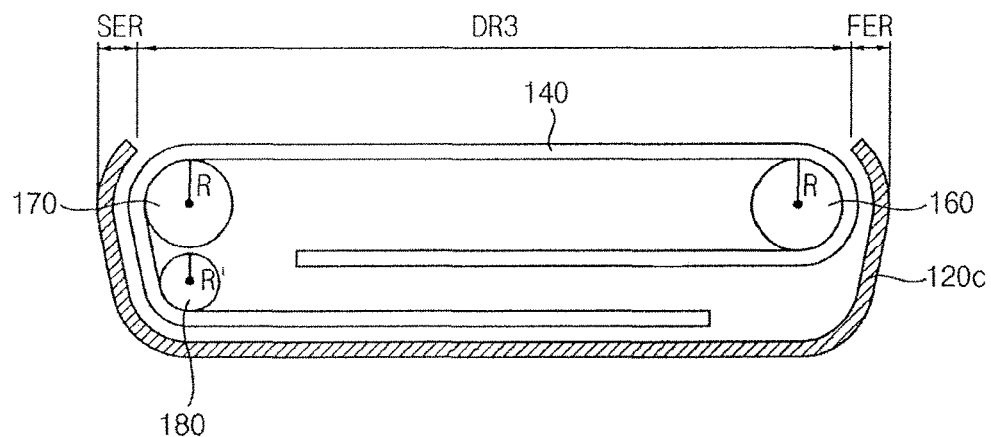

FIGS. 4A-4C illustrates various embodiments of edge regions of a housing in the sliding display device of FIG. 1. Referring to FIG. 4A, a housing 120a in the sliding display device 100 may include the first edge region FER and the second edge region SER. In this embodiment, only a flat panel region of the flexible display panel 140 is exposed to the user. Thus, the display region DR1 between the first edge region FER and the second edge region SER may include the flat panel region of the flexible display panel 140. The user may not perceive a curved panel region of the flexible display panel 140, and thus may watch an image displayed on the flat panel region of the flexible display panel 140.

Referring to FIG. 4B, the housing 120b in the sliding display device 100 may include the first edge region FER and the second edge region SER which allow both the flat panel region and the curved panel region of the flexible display panel 140 to be exposed to a user. Thus, the display region DR2 between the first edge region FER and the second edge region SER may include the flat panel region and the curved panel region of the flexible display panel 140. In this case, the user may not perceive the first edge region FER and the second edge region SER when the user observes the sliding display device 100 in front of the housing 120b of the sliding display device 100. Thus, the user may watch an image displayed on both the flat panel region and the curved panel region of the flexible display panel 140. In one embodiment, an icon for executing an application program displayed on the flat panel region of the flexible display panel 140 may be displayed on the curved panel region of the flexible display panel 140.

Referring to FIG. 4C, the housing 120c in the sliding display device 100 may include the first edge region FER and the second edge region SER which allow both the flat panel region and a portion of the curved panel region of the flexible display panel 140 to be exposed to the user. Thus, the display region DR3 between the first edge region FER and the second edge region SER may include the flat panel region and the portion of the curved panel region of the flexible display panel 140. In this case, a user may watch an image displayed on both the flat panel region and the portion of the curved panel region of the flexible display panel 140.

As described above, since the radius of rotation R of the first main roller 160 is equal to the radius of rotation R of the second main roller 170, and the first and second main rollers 160 and 170 form the curved panel region of the flexible display panel 140 in a front direction of the housing 120a, 120b, and 120c, the user may perceive that the display region DR1, DR2, and DR3 adjacent to the first edge region FER and the display region DR1, DR2, and DR3 adjacent to the second edge region SER to ne symmetrical.

Figure 5:
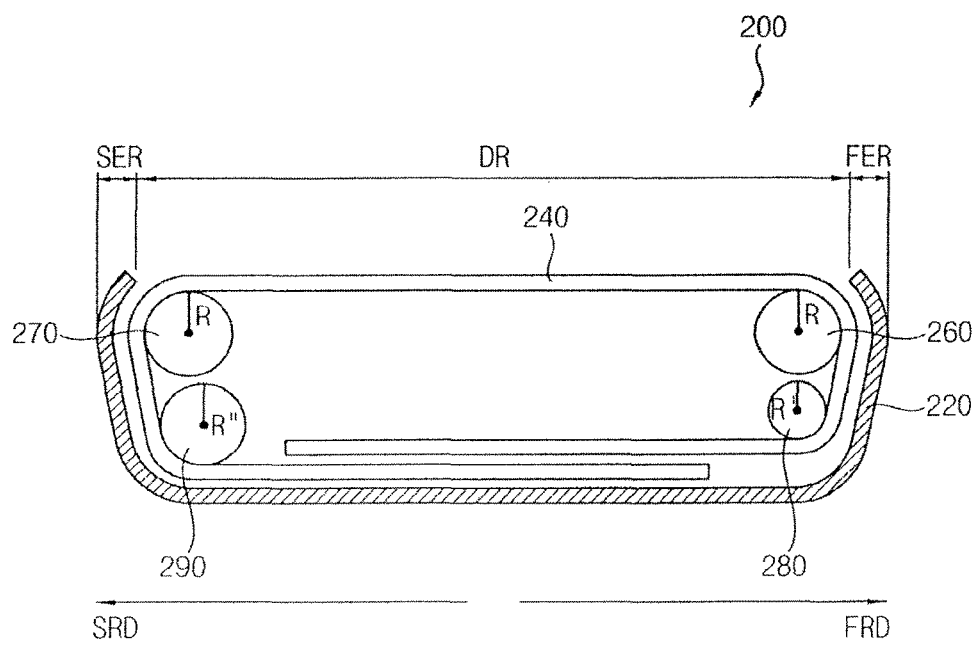
FIG. 5 illustrates another embodiment of a sliding display device.

FIG. 5 illustrates another embodiment of a sliding display device 200 in cross-section. Referring to FIG. 5, the sliding display device 200 may include a housing 220, a flexible display panel 240, a first main roller 260, a second main roller 270, a first assistant roller 280, and a second assistant roller 290. The sliding display device 200 may include a driving integrated circuit that drives the flexible display panel 240, a power supply circuit that supplies driving power to the flexible display panel 240, etc., in the housing 220.

The housing 220 may include a display region DR between a first edge region FER and a second edge region SER. The flexible display panel 240 may be exposed to a user through the display region DR in a front direction of the housing 220. Thus, the sliding display device 200 may display an image on the flexible display panel 240 corresponding to the display region DR. In example embodiments, the distance between the first edge region FER and the second edge region SER may change as the housing 220 is expanded or contracted in a first direction FRD and a second direction SRD opposite to the first direction FRD. Thus, since the size of the display region DR is proportional to the distance between the first edge region FER and the second edge region SER, the size of the display region DR may be increased or decreased as housing 220 is expanded or contracted in the first direction FRD and the second direction SRD.

In an example embodiment, the first edge region FER may be a top edge region (or, a bottom edge region) of the housing 220, and the second edge region SER may be the bottom edge region (or, the top edge region) of the housing 220, when the housing 220 is expanded or contracted in a top-bottom direction.

In another example embodiment, the first edge region FER may be a right edge region (or, a left edge region) of the housing 220, and the second edge region SER may be the left edge region (or, the right edge region) of the housing 220, when the housing 220 is expanded or contracted in a left-right direction.

The flexible display panel 240 may slide out from the housing 220 through the first and second edge regions FER and SER when the housing 220 is expanded in the first direction FRD and the second direction SRD. The flexible display panel 240 may slide into the housing 220 through the first and second edge regions FER and SER when the housing 220 is contracted in the first direction FRD and the second direction SRD.

Since the flexible display panel 240 is manufactured with flexible materials, the flexible display panel 240 may be guided into an empty space of the housing 220 by the first main roller 260, the second main roller 270, the first assistant roller 280, and the second assistant roller 290, after sliding into the housing 220. The housing 220 may include various shapes of path-structures through which the flexible display panel 240 is moved in the housing 220. The flexible display panel 240 may include a plurality of pixels. The flexible display panel 240 may be driven by the driving integrated circuit. The flexible display panel 240 may display an image using the pixels.

The first main roller 260 may guide a first panel region of the flexible display panel 240, which is slid into the housing 220 through the first edge region FER, into an empty space of the housing 220. The first assistant roller 280 may assist the first main roller 260 to move the first panel region of the flexible display panel 240 along a first moving path in the empty space of the housing 220. For example, in FIG. 5, the first moving path may extend from the first edge region FER to the second edge region SER in the second direction SRD.

In an example embodiment, the first assistant roller 280 may be apart from the first main roller 260. The second main roller 270 may guide a second panel region of the flexible display panel 240, which is slid into the housing 220 through the second edge region SER, into the empty space of the housing 220. The radius of rotation R of the second main roller 270 may be equal to a radius of rotation R of the first main roller 260. When the radius of rotation R of the second main roller 270 is equal to the radius of rotation R of the first main roller 260, a user may perceive the display region DR adjacent to the first edge region FER and the display region DR adjacent to the second edge region SER to be symmetrical.

The second assistant roller 290 may assist the second main roller 270 to allow the second panel region of the flexible display panel 240 to move along a second moving path that does not intersect the first moving path in the empty space of the housing 220. For example, in FIG. 5, the second moving path may extend from the second edge region SER to the first edge region FER in the first direction FRD. In an example embodiment, the second assistant roller 290 may be apart from the second main roller 270.

In an example embodiment, as illustrated in FIG. 5, the radius of rotation R' of the first assistant roller 280 may be different from a radius of rotation R" of the second assistant roller 290. In another example embodiment, the radius of rotation R' of the first assistant roller 280 may be equal to the radius of rotation R" of the second assistant roller 290. In this case, to prevent the first moving path of the first panel region of the flexible display panel 240 from intersecting the second moving path of the second panel region of the flexible display panel 240, a relative location of the first assistant roller 280 from the first main roller 260 may be different from a relative location of the second assistant roller 290 from the second main roller 270.

In some example embodiments, the radius of rotation R' of the first assistant roller 280 may be different from the radius of rotation R of the first main roller 260, and the radius of rotation R" of the second assistant roller 290 may be different from the radius of rotation R of the second main roller 270. The first and second assistant rollers 280 and 290 prevent the second panel region of the flexible display panel 240 from colliding with the first panel region of the flexible display panel 240 (e.g., prevent the second moving path of the second panel region of the flexible display panel 240 from intersecting the first moving path of the first panel region of the flexible display panel 240), the radius of rotation R' of the first assistant roller 280 and the radius of rotation R" of the second assistant roller 290 may be relatively small when considering the thickness of the sliding display device 200.

Thus, as illustrated in FIG. 5, the radius of rotation R' of the first assistant roller 280 may be less than the radius of rotation R of the first main roller 260. Also, the radius of rotation R" of the second assistant roller 290 may be less than the radius of rotation R of the second main roller 270. However, in some example embodiments, the radius of rotation R' of the first assistant roller 280 may be equal to or greater than the radius of rotation R of the first main roller 260, and the radius of rotation R" of the second assistant roller 290 may be equal to or greater than the radius of rotation R of the second main roller 270.

The sliding display device 200 may therefore have a two-way sliding structure, in which the flexible display panel 240 slides into the housing 220 through the first and second edge regions FER and SER of the housing 220 and then is guided into the empty space of the housing 220. The sliding display device 200 includes the first main roller 260 and the first assistant roller 280 allow the first panel region of the flexible display panel 240 to slide into the housing 220 through the first edge region FER along the first moving path in the empty space of the housing 220. The second main roller 270 and the second assistant roller 290 allow the second panel region of the flexible display panel 240 to slide into the housing 220 through the second edge region SER along the second moving path that does not intersect the first moving path in the empty space of the housing 220. As a result, the sliding display device 200 may achieve an increased or maximum size of the flexible display panel 240 utilizing the empty space of the housing 220 to the an increased or maximum amount. Also, a user perceives the display region DR adjacent to the first edge region FER and the display region DR adjacent to the second edge region SER to be symmetrical. FIG. 5 shows one first assistant roller 280 that assists the first main roller 260 and one second assistant roller 290 that assists the second main roller 270. In some example embodiments, two or more first assistant rollers 280 may assist the first main roller 260, and/or two or more second assistant rollers 290 may assist the second main roller 270.

Figure 6:
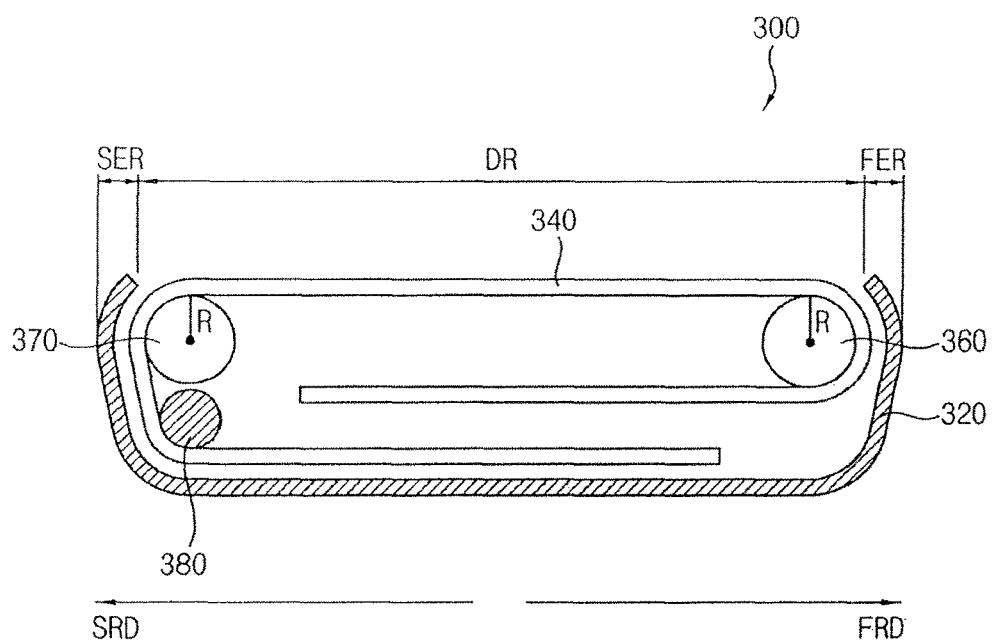
FIG. 6 illustrates another embodiment of a sliding display device.

FIG. 6 illustrates another embodiment of a sliding display device 300 which may include a housing 320, a flexible display panel 340, a first main roller 360, a second main roller 370, and a support beam 380. The sliding display device 300 may include a driving integrated circuit that drives the flexible display panel 340, a power supply circuit that supplies driving power to the flexible display panel 340, etc., in housing 320.

The housing 320 may include a display region DR between a first edge region FER and a second edge region SER. The flexible display panel 340 may be exposed to a user through the display region DR in a front direction of the housing 320. Thus, the sliding display device 300 may display an image on the flexible display panel 340 corresponding to the display region DR. In example embodiments, the distance between the first edge region FER and the second edge region SER may change as the housing 320 is expanded or contracted in a first direction FRD and a second direction SRD opposite to the first direction FRD. Thus, since the size of the display region DR is proportional to the distance between the first edge region FER and the second edge region SER, the size of the display region DR may be increased or decreased as the housing 320 is expanded or contracted in the first direction FRD and the second direction SRD.

In an example embodiment, the first edge region FER may be a top edge region (or, a bottom edge region) of the housing 320 and the second edge region SER may be the bottom edge region (or, the top edge region) of the housing 320 when the housing 320 is expanded or contracted in a top-bottom direction.

In another example embodiment, the first edge region FER may be a right edge region (or, a left edge region) of the housing 320 and the second edge region SER may be the left edge region (or, the right edge region) of the housing 320 when the housing 320 is expanded or contracted in a left-right direction.

The flexible display panel 340 may slide out from the housing 320 through the first and second edge regions FER and SER when the housing 320 is expanded in the first direction FRD and the second direction SRD. The flexible display panel 340 may slide into the housing 320 through the first and second edge regions FER and SER when the housing 320 is contracted in the first direction FRD and the second direction SRD.

The flexible display panel 340 is manufactured with flexible materials. The flexible display panel 340 may be guided into an empty space of the housing 320 by the first main roller 360, the second main roller 370, and the support beam 380 after being slid into the housing 320. The housing 320 may include various shapes of path-structures through which the flexible display panel 340 is moved in the housing 320. The flexible display panel 340 may include a plurality of pixels. The flexible display panel 340 may be driven by the driving integrated circuit. The flexible display panel 340 may display an image using the pixels.

The first main roller 360 may guide a first panel region of the flexible display panel 340, that is slid into the housing 320 through the first edge region FER, into an empty space of the housing 320 and may move the first panel region of the flexible display panel 340 along a first moving path in the empty space of the housing 320. For example, in FIG. 6, the first moving path may be a path corresponding to the second direction SRD from the first edge region FER to the second edge region SER. The second main roller 370 may guide a second panel region of the flexible display panel 340, which is slid into the housing 320 through the second edge region SER, into the empty space of the housing 320.

The radius of rotation R of the second main roller 370 may be equal to a radius of rotation R of the first main roller 360. Since the radius of rotation R of the second main roller 370 is equal to the radius of rotation R of the first main roller 360, a user may perceive the display region DR adjacent to the first edge region FER and the display region DR adjacent to the second edge region SER to be symmetrical.

The support beam 380 may support the second panel region of the flexible display panel 340 to move the second panel region of the flexible display panel 340 along a second moving path that does not intersect the first moving path in the empty space of housing 320. For example, in FIG. 6, the second moving path may extend from the second edge region SER to the first edge region FER in the first direction FRD. The support beam 380 may have, for example, a cylindrical shape to reduce or minimize frictional force between the support beam 380 and the flexible display panel 340.

In an example embodiment, the support beam 380 may be apart from the second main roller 370. The support beam 380 may prevent the second panel region of the flexible display panel 340 from colliding with the first panel region of the flexible display panel 340 (e.g., prevent the second moving path of the second panel region of the flexible display panel 340 from intersecting the first moving path of the first panel region of the flexible display panel 340). The radius of curvature of the support beam 380 may be relatively small considering the thickness of the sliding display device 300. Thus, as illustrated in FIG. 6, the radius of curvature of the support beam 380 may be less than the radius of rotation R of the second main roller 370. In some example embodiments, the radius of curvature of the support beam 380 may be equal to or greater than the radius of rotation R of the second main roller 370.

In accordance with the present embodiment, the sliding display device 300 may have a two-way sliding structure, in which the flexible display panel 340 slides into the housing 320 through the first and second edge regions FER and SER of the housing 320 and then is guided into the empty space of the housing 320. The sliding display device 300 includes the first main roller 360 that allows the first panel region of the flexible display panel 340 to slide into the housing 320 through the first edge region FER along the first moving path in the empty space of the housing 320. The second main roller 370 and the support beam 380 allows the second panel region of the flexible display panel 340 to slide into the housing 320 through the second edge region SER along the second moving path that does not intersect the first moving path in the empty space of the housing 320.

As a result, the sliding display device 300 may achieve an increased or maximum size of the flexible display panel 340 by utilizing the empty space of the housing 320 to an increased or maximum extent. Also, a user perceives the display region DR adjacent to the first edge region FER and the display region DR adjacent to the second edge region SER to be symmetrical. In FIG. 6, one support beam 380 assists the second main roller 370. In some example embodiments, two or more support beams 380 may assist the second main roller 370.

Figure 7:
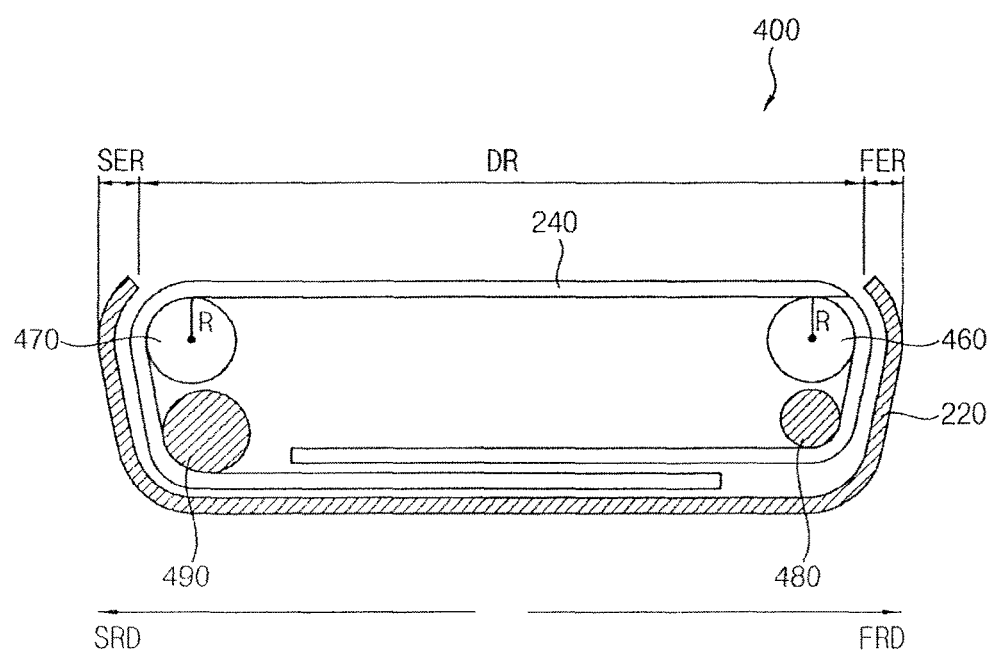
FIG. 7 illustrates another embodiment of a sliding display device.

FIG. 7 illustrates another embodiment of a sliding display device 400 which may include a housing 420, a flexible display panel 440, a first main roller 460, a second main roller 470, a first support beam 480, and a second support beam 490. The sliding display device 400 may include a driving integrated circuit that drives the flexible display panel 440, a power supply circuit that supplies driving power to the flexible display panel 440, etc., in the housing 420.

The housing 420 may include a display region DR between a first edge region FER and a second edge region SER. The flexible display panel 440 may be exposed to a user through the display region DR in a front direction of the housing 420. Thus, the sliding display device 400 may display an image on the flexible display panel 440 corresponding to the display region DR. In example embodiments, the distance between the first edge region FER and the second edge region SER may change as the housing 420 is expanded or contracted in a first direction FRD and a second direction SRD, which is opposite to the first direction FRD. For example, the size of the display region DR is proportional to the distance between the first edge region FER and the second edge region SER. Thus, the size of the display region DR may be increased or decreased as the housing 420 is expanded or contracted in the first direction FRD and the second direction SRD.

In an example embodiment, the first edge region FER may be a top edge region (or, a bottom edge region) of the housing 420, and the second edge region SER may be the bottom edge region (or, the top edge region) of the housing 420, when the housing 420 is expanded or contracted in a top-bottom direction. In another example embodiment, the first edge region FER may be a right edge region (or, a left edge region) of the housing 420, and the second edge region SER may be the left edge region (or, the right edge region) of the housing 420, when the housing 420 is expanded or contracted in a left-right direction.

The flexible display panel 440 may slide out from the housing 420 through the first and second edge regions FER and SER when the housing 420 is expanded in the first direction FRD and the second direction SRD. The flexible display panel 440 may slide into the housing 420 through the first and second edge regions FER and SER when the housing 420 is contracted in the first direction FRD and the second direction SRD.

Since the flexible display panel 440 is manufactured with flexible materials, the flexible display panel 440 may be guided into an empty space of the housing 420 by the first main roller 460, the second main roller 470, the first support beam 480, and the second support beam 490 after being slid into the housing 420. The housing 420 may include various shapes of path-structures through which the flexible display panel 440 is moved in the housing 420. The flexible display panel 440 may include a plurality of pixels. The flexible display panel 440 may be driven by the driving integrated circuit. The flexible display panel 440 may display an image using the pixels.

The first main roller 460 may guide a first panel region of the flexible display panel 440, which is slid into the housing 420 through the first edge region FER, into an empty space of the housing 420. The first support beam 480 may support the first panel region of the flexible display panel 440, to allow the first panel region of the flexible display panel 440 to move along a first moving path in the empty space of the housing 420. For example, in FIG. 7, the first moving path may be a path corresponding to the second direction SRD from the first edge region FER to the second edge region SER. The first support beam 480 may have, for example, a cylindrical shape to reduce or minimize frictional force between the first support beam 480 and the flexible display panel 440.

In an example embodiment, the first support beam 480 may be apart from the first main roller 460. The second main roller 470 may guide a second panel region of the flexible display panel 440, which is slid into the housing 420 through the second edge region SER, into the empty space of the housing 420. The radius of rotation R of the second main roller 470 may be equal to a radius of rotation R of the first main roller 460. Since the radius of rotation R of the second main roller 470 is equal to the radius of rotation R of the first main roller 460, a user may perceive the display region DR adjacent to the first edge region FER and the display region DR adjacent to the second edge region SER to be symmetrical.

The second support beam 490 may support the second panel region of the flexible display panel 440, to allow the second panel region of the flexible display panel 440 to move along a second moving path that does not intersect the first moving path in the empty space of the housing 420. For example, as illustrated in FIG. 7, the second moving path may correspond to the first direction FRD from the second edge region SER to the first edge region FER. The second support beam 490 may have, for example, a cylindrical shape to reduce or minimize frictional force between the second support beam 490 and the flexible display panel 440. In an example embodiment, the second support beam 490 may be apart from the second main roller 470.

In an example embodiment, as illustrated in FIG. 7, the radius of curvature of the first support beam 480 may be different from a radius of curvature of the second support beam 490. In another example embodiment, the radius of curvature of the first support beam 480 may be equal to the radius of curvature of the second support beam 490. In this case, to prevent the first moving path of the first panel region of the flexible display panel 440 from intersecting the second moving path of the second panel region of the flexible display panel 440, the relative location of the first support beam 480 from the first main roller 460 may be different from a relative location of the second support beam 490 from the second main roller 470.

In some example embodiments, the radius of curvature of the first support beam 480 may be different from the radius of rotation R of the first main roller 460, and the radius of curvature of the second support beam 490 may be different from the radius of rotation R of the second main roller 470. The first and second support beams 480 and 490 may prevent the second panel region of the flexible display panel 440 from colliding with the first panel region of the flexible display panel 440 (e.g., prevent the second moving path of the second panel region of the flexible display panel 440 from intersecting the first moving path of the first panel region of flexible display panel 440).

The radius of curvature of the first support beam 480 and the radius of curvature of the second support beam 490 may be relatively small considering a thickness of the sliding display device 400. Thus, as illustrated in FIG. 7, the radius of curvature of the first support beam 480 may be less than the radius of rotation R of the first main roller 460, and the radius of curvature of the second support beam 490 may be less than the radius of rotation R of the second main roller 470. In some example embodiments, the radius of curvature of the first support beam 480 may be equal to or greater than the radius of rotation R of the first main roller 460, and the radius of curvature of the second support beam 490 may be equal to or greater than the radius of rotation R of the second main roller 470.

In the present embodiment, the sliding display device 400 may have a two-way sliding structure, in which the flexible display panel 440 slides into the housing 420 through the first and second edge regions FER and SER of the housing 420 and then is guided into the empty space of the housing 420. The sliding display device 400 includes the first main roller 460 and the first support beam 480 that allow the first panel region of the flexible display panel 440 to slide into the housing 420 through the first edge region FER along the first moving path in the empty space of the housing 420. The second main roller 470 and the second support beam 490 allow the second panel region of the flexible display panel 440 to slide into the housing 420 through the second edge region SER along the second moving path that does not intersect the first moving path in the empty space of the housing 420.

As a result, the sliding display device 400 may achieve an increased or maximum size of the flexible display panel 440 by utilizing the empty space of the housing 420 to an increased or maximum extent, and may allow the user to perceive that the display region DR adjacent to the first edge region FER and the display region DR adjacent to the second edge region SER are symmetrical. In FIG. 7, one first support beam 480 assists the first main roller 460 and one second support beam 490 assists the second main roller 470. In some example embodiments, two or more first support beams 480 may assist the first main roller 460 and two or more second support beams 490 may assist the second main roller 470.

Figure 8:
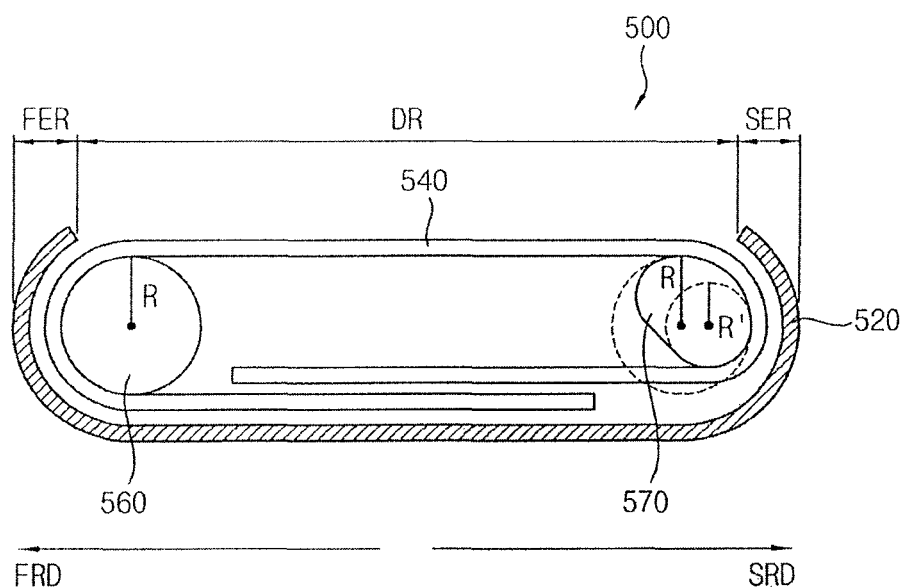
FIG. 8 illustrates another embodiment of a sliding display device.

FIG. 8 illustrates another embodiment of a sliding display device 500 which may include a housing 520, a flexible display panel 540, a first support beam 560, and a second support beam 570. The sliding display device 500 may include a driving integrated circuit that drives the flexible display panel 540, a power supply circuit that supplies driving power to the flexible display panel 540, etc., in the housing 520.

The housing 520 may include a display region DR that is between a first edge region FER and a second edge region SER. The flexible display panel 540 may be exposed to a user through the display region DR in a front direction of the housing 520. Thus, the sliding display device 500 may display an image on the flexible display panel 540 corresponding to the display region DR.

In example embodiments, the distance between the first edge region FER and the second edge region SER may change as the housing 520 is expanded or contracted in a first direction FRD and a second direction SRD, which is opposite to the first direction FRD. For example, the size of the display region DR may be proportional to the distance between the first edge region FER and the second edge region SER. The size of the display region DR may therefore be increased or decreased as the housing 520 is expanded or contracted in the first direction FRD and the second direction SRD.

In an example embodiment, the first edge region FER may be a top edge region (or, a bottom edge region) of the housing 520, and the second edge region SER may be the bottom edge region (or, the top edge region) of the housing 520, when the housing 520 is expanded or contracted in a top-bottom direction.

In another example embodiment, the first edge region FER may be a right edge region (or, a left edge region) of the housing 520, and the second edge region SER may be the left edge region (or, the right edge region) of the housing 520, when the housing 520 is expanded or contracted in a left-right direction.

The flexible display panel 540 may slide out from the housing 520 through the first and second edge regions FER and SER when the housing 520 is expanded in the first direction FRD and the second direction SRD. The flexible display panel 540 may slide into the housing 520 through the first and second edge regions FER and SER when the housing 520 is contracted in the first direction FRD and the second direction SRD.

Since the flexible display panel 540 is manufactured with flexible materials, the flexible display panel 540 may be guided into an empty space of the housing 520 by the first support beam 560 and the second support beam 570, after sliding into the housing 520. The housing 520 may include various shapes of path-structures through which the flexible display panel 540 is moved in the housing 520. The flexible display panel 540 may include a plurality of pixels. The flexible display panel 540 may be driven by the driving integrated circuit and may display an image using the pixels.

The first support beam 560 may have, for example, a cylindrical shape with a radius of curvature R. The first support beam 560 may guide a first panel region of the flexible display panel 540, which is slid into the housing 520 through the first edge region FER, into an empty space of the housing 520. The first support beam 560 may support the first panel region of the flexible display panel 540, to allow the first panel region of the flexible display panel 540 to move along a first moving path in the empty space of the housing 520.

The second support beam 570 may have, for example, a cylindrical shape with a first radius of curvature R in a front direction of the housing 520 and may have a second radius of curvature R' that is different from the first radius of curvature R in a back direction of the housing 520. The second support beam 570 may guide a second panel region of the flexible display panel 540, which is slid into the housing 520 through the second edge region SER, into the empty space of the housing 520.

The second support beam 570 may support the second panel region of the flexible display panel 540, to allow the second panel region of the flexible display panel 540 to move along a second moving path that does not intersect the first moving path in the empty space of the housing 520. Since the first radius of curvature R of the second support beam 570 may be equal to the radius of curvature R of the first support beam 560 in the front direction of the housing 520. Thus, a user may perceive the display region DR adjacent to the first edge region FER and the display region DR adjacent to the second edge region SER to be symmetrical.

In addition, the second radius of curvature R' of the second support beam 570 may be different from the radius of curvature R of the first support beam 560 in the back direction of the housing 520. Thus, the first moving path of the first panel region of the flexible display panel 540 may be prevented from intersecting the second moving path of the second panel region of the flexible display panel 540 in the empty space of the housing 520. As illustrated in FIG. 8, the first radius of curvature R of the second support beam 570 may be greater than the second radius of curvature R' of the second support beam 570.

In the present embodiment, the sliding display device 500 may have a two-way sliding structure, in which the flexible display panel 540 slides into the housing 520 through the first and second edge regions FER and SER of the housing 520 and then is guided into the empty space of the housing 520. The sliding display device 500 includes the first support beam 560 and a second support beam 570. The first support beam 560 allows the first panel region of the flexible display panel 540 to slide into the housing 520 through the first edge region FER along the first moving path in the empty space of the housing 520. The second support beam 570 allows the second panel region of the flexible display panel 540 to slide into the housing 520 through the second edge region SER along the second moving path that does not intersect the first moving path in the empty space of the housing 520. As a result, the sliding display device 500 may achieve an increased or maximum size of the flexible display panel 540 by utilizing the empty space of the housing 520 to an increased or maximum extent. Also, these features may allow a user to perceive the display region DR adjacent to the first edge region FER and the display region DR adjacent to the second edge region SER to be symmetrical.

Figure 9:
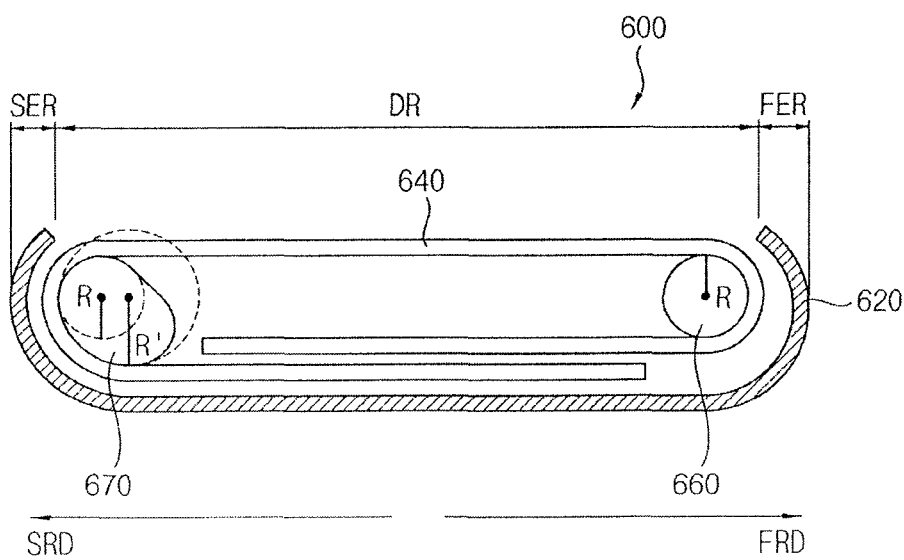
FIG. 9 illustrates another embodiment of a sliding display device.

FIG. 9 illustrates another embodiment of a sliding display device 600 which may include a housing 620, a flexible display panel 640, a first support beam 660, and a second support beam 670. The sliding display device 600 may include a driving integrated circuit to drive the flexible display panel 640, a power supply circuit to supply driving power to the flexible display panel 640, etc., in the housing 620.

The housing 620 may include a display region DR between a first edge region FER and a second edge region SER. The flexible display panel 640 may be exposed to a user through the display region DR in a front direction of the housing 620. Thus, the sliding display device 600 may display an image on the flexible display panel 640 corresponding to the display region DR. In example embodiments, the distance between the first edge region FER and the second edge region SER may change as the housing 620 is expanded or contracted in a first direction FRD and a second direction SRD, which is opposite to the first direction FRD. For example, since a size of the display region DR is proportional to the distance between the first edge region FER and the second edge region SER, the size of the display region DR may therefore be increased or decreased as the housing 620 is expanded or contracted in the first direction FRD and the second direction SRD.

In an example embodiment, the first edge region FER may be a top edge region (or, a bottom edge region) of the housing 620, and the second edge region SER may be the bottom edge region (or, the top edge region) of the housing 620, when the housing 620 is expanded or contracted in a top-bottom direction. In another example embodiment, the first edge region FER may be a right edge region (or, a left edge region) of the housing 620, and the second edge region SER may be the left edge region (or, the right edge region) of the housing 620, when the housing 620 is expanded or contracted in a left-right direction.

The flexible display panel 640 may slide out from the housing 620 through the first and second edge regions FER and SER when the housing 620 is expanded in the first direction FRD and the second direction SRD. The flexible display panel 640 may slide into the housing 620 through the first and second edge regions FER and SER when the housing 620 is contracted in the first direction FRD and the second direction SRD.

Since the flexible display panel 640 is manufactured with flexible materials, the flexible display panel 640 may be guided into an empty space of the housing 620 by the first support beam 660 and the second support beam 670, after sliding into the housing 620. The housing 620 may include various shapes of path-structures to allow the flexible display panel 640 to move in the housing 620. The flexible display panel 640 may include a plurality of pixels. The flexible display panel 640 may be driven by the driving integrated circuit. The flexible display panel 640 may display an image using the pixels.

The first support beam 660 may have, for example, a cylindrical shape with a radius of curvature R. The first support beam 660 may guide a first panel region of the flexible display panel 640, which slides into the housing 620 through the first edge region FER, into an empty space of the housing 620. The first support beam 660 may support the first panel region of the flexible display panel 640, to allow the first panel region of the flexible display panel 640 to move along a first moving path in the empty space of the housing 620.

The second support beam 670 may have, for example, a cylindrical shape with a first radius of curvature R in a front direction of the housing 620 and a second radius of curvature R' different from the first radius of curvature R in a back direction of the housing 620. The second support beam 670 may guide a second panel region of the flexible display panel 640, which slides into the housing 620 through the second edge region SER, into the empty space of the housing 620. The second support beam 670 may support the second panel region of the flexible display panel 640, to allow the second panel region of the flexible display panel 640 to move along a second moving path that does not intersect the first moving path in the empty space of the housing 620.

Since the first radius of curvature R of the second support beam 670 is equal to the radius of curvature R of the first support beam 660 in the front direction of the housing 620, a user may perceive the display region DR adjacent to the first edge region FER and the display region DR adjacent to the second edge region SER to be symmetrical.

In addition, since the second radius of curvature R' of the second support beam 670 is different from the radius of curvature R of the first support beam 660 in the back direction of the housing 620, the first moving path of the first panel region of the flexible display panel 640 may be prevented from intersecting the second moving path of the second panel region of the flexible display panel 640 in the empty space of the housing 620. As illustrated in FIG. 9, the first radius of curvature R of the second support beam 670 may be less than the second radius of curvature R' of the second support beam 670.

The sliding display device 600 may have a two-way sliding structure, in which the flexible display panel 640 slides into the housing 620 through the first and second edge regions FER and SER of the housing 620 and then is guided into the empty space of the housing 620. The sliding display device 600 includes the first support beam 660 and a second support beam 670. The first support beam 660 moves the first panel region of the flexible display panel 640, which slides into the housing 620 through the first edge region FER, along the first moving path in the empty space of the housing 620. The second support beam 670 moves the second panel region of the flexible display panel 640, which slides into the housing 620 through the second edge region SER, along the second moving path that does not intersect the first moving path in the empty space of the housing 620. As a result, the sliding display device 600 may achieve an increased or maximum size of the flexible display panel 640 by utilizing the empty space of the housing 620 to an increased or maximum extent. Also, a user may perceive the display region DR adjacent to the first edge region FER and the display region DR adjacent to the second edge region SER to be symmetrical.

Figure 10:
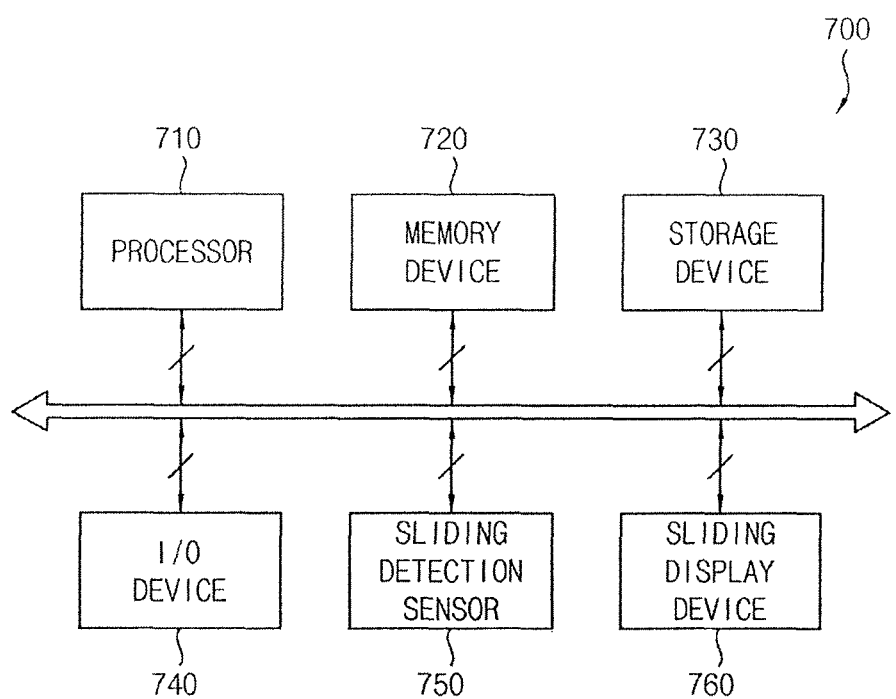
FIG. 10 illustrates an embodiment of an electronic device.

FIG. 10 illustrates an embodiment of an electronic device 700 which may include a processor 710, a memory device 720, a storage device 730, an input/output (I/O) device 740, a sliding detection sensor 750, and a sliding display device 760. The sliding display device 760 may correspond to the sliding display device of any of the aforementioned embodiments.

The sliding display device 760 may be implemented by an organic light emitting display (OLED) device, a liquid crystal display (LCD) device, or another type of display device. In addition, the electronic device 700 may include a plurality of ports, for example, for communicating with a video card, a sound card, a memory card, a universal serial bus (USB) device, or other electronic devices. The electronic device 700 may be implemented, for example, as a cellular phone, a smart phone, a video phone, a smart pad, a smart watch, a tablet PC, a car navigation system, a television, a computer monitor, a laptop, or a head mounted display (HMD) device.

The processor 710 may perform various computing functions. The processor 710 may control a displaying operation of the sliding display device 760 based on a sliding detection signal output from the sliding detection sensor 750. The sliding detection signal may indicate, for example, whether a flexible display panel is slid into the housing of the sliding display device 760 and/or whether the flexible display panel is slid out from the housing. The processor 710 may be, for example, a micro processor, a central processing unit (CPU), an application processor (AP), or another processing device or controller. The processor 710 may be coupled to other components via an address bus, a control bus, a data bus, or another communication path. Further, the processor 710 may be coupled to an extended bus such as a peripheral component interconnection (PCI) bus.

The memory device 720 may store data for operations of the electronic device 700. The memory device 720 may be or include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc.

The storage device 730 may include a solid state drive (SSD) device, a hard disk drive (HDD) device, a CD-ROM device, etc. The I/O device 740 may include an input device such as a keyboard, a keypad, a mouse device, a touchpad, a touch-screen, etc, and an output device such as a printer, a speaker, etc. In some example embodiments, the electronic device 700 may include a power supply that supplies power for operations of the electronic device 700.

The sliding detection sensor 750 may generate the sliding detection signal for output to the processor 710. Thus, the sliding display device 760 may perform a displaying operation suitable to an exposure of the flexible display panel. For example, the sliding display device 760 may perform a displaying operation according to a size of a display region (e.g., a region of the flexible display panel that is exposed to a user). The sliding display device 760 may be coupled to other components via the buses or other communication links. In some example embodiments, the sliding display device 760 may be in the I/O device 740.

As described above, the sliding display device 760 may have a two-way sliding structure, in which the flexible display panel slides into the housing through first and second edge regions and then is guided into an empty space of the housing. The sliding display device 760 may include a display region that is between a first edge region and a second edge region. The sliding display device 760 may include the housing that is expanded or contracted in a first direction and a second direction opposite to the first direction (e.g., a distance between the first edge region and the second edge region is changed). The flexible display panel slides out from the housing through the first and second edge regions to expand the housing and slides into the housing through the first and second edge regions to contract the housing.

In an example embodiment, the sliding display device 760 may include a first main roller and a second main roller. The first main roller guides a first panel region of the flexible display panel, which is slid into the housing through the first edge region, into an empty space of the housing and moves the first panel region along a first moving path in the empty space of the housing. The second main roller guides a second panel region of the flexible display panel, which is slid into the housing through the second edge region, into the empty space of the housing. The radius of rotation of the first main roller is equal to a radius of rotation of the second main roller. An assistant roller may assist the second main roller to move the second panel region along a second moving path that does not intersect the first moving path in the empty space of the housing.

In another example embodiment, the sliding display device 760 may include a first main roller, a first assistant roller, a second main roller, and a second assistant roller. The first main roller guides a first panel region of the flexible display panel, which is slid into the housing through the first edge region, into an empty space of the housing. The first assistant roller assists the first main roller to move the first panel region along a first moving path in the empty space of the housing. The second main roller guides a second panel region of the flexible display panel, which is slid into the housing through the second edge region, into the empty space of the housing. The radius of rotation of the first main roller is equal to a radius of rotation of the second main roller. The second assistant roller assists the second main roller to move the second panel region along a second moving path that does not intersect the first moving path in the empty space of the housing.

In another example embodiment, the sliding display device 760 may include a first main roller, a second main roller, and a support beam. The first main roller guides a first panel region of the flexible display panel, which is slid into the housing through the first edge region, into an empty space of the housing and moves the first panel region along a first moving path in the empty space of the housing. The second main roller guides a second panel region of the flexible display panel, which is slid into the housing through the second edge region, into the empty space of the housing. The radius of rotation of the first main roller is equal to a radius of rotation of the second main roller. The support beam supports the second panel region to allow the second panel region to move along a second moving path that does not intersect the first moving path in the empty space of the housing.

In another example embodiment, the sliding display device 760 may include a first main roller, a second main roller, a first support beam, and a second support beam. The first main roller guides a first panel region of the flexible display panel, which is slid into the housing through the first edge region, into an empty space of the housing. The first support beam supports the first panel region to allow the first panel region to move along a first moving path in the empty space of the housing. The second main roller guides a second panel region of the flexible display panel, which is slid into the housing through the second edge region, into the empty space of the housing. The radius of rotation of the first main roller is equal to a radius of rotation of the second main roller. The second support beam supports the second panel region to allow the second panel region to move along a second moving path that does not intersect the first moving path in the empty space of the housing.

In another example embodiment, the sliding display device 760 may include a first support beam and a second support beam. The first support beam guides a first panel region of the flexible display panel, which is slid into the housing through the first edge region, into an empty space of the housing, and supports the first panel region to allow the first panel region to move along a first moving path in the empty space of the housing. The first support beam may have, for example, a cylindrical shape with a first radius of curvature.

The second support beam guides a second panel region of the flexible display panel, that is slid into the housing through the second edge region, into the empty space of the housing, and supports the second panel region to allow the second panel region to move along a second moving path that does not intersect the first moving path in the empty space of the housing. The second support beam may have, for example, a cylindrical shape with a first radius of curvature in a front direction of the housing and a second radius of curvature different from the first radius of curvature in a back direction of the housing.

Thus, the sliding display device 760 includes at least one roller and/or at least one support beam to achieve an increased or maximum size of the flexible display panel, by utilizing the empty space of the housing to an increased or maximum extent. Also, these features may allow a user (e.g., a viewer) to perceive that the display region adjacent to the first edge region and the display region adjacent to the second edge region are symmetrical.

The electronic device may be, for example, a cellular phone, a smart phone, a video phone, a smart pad, a smart watch, a tablet PC, a car navigation system, a television, a computer monitor, a laptop, or a head mounted display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the following claims.

What is claimed is:

1. A sliding display device, comprising:
a housing including a display region between a first edge region and a second edge region, a distance between the first edge region and the second edge region to change as the housing is expanded or contracted in a first direction and a second direction opposite to the first direction;
a flexible display panel to slide out from the housing through the first and second edge regions as the housing is expanded and to slide into the housing through the first and second edge regions as the housing is contracted;
a first main roller to guide a first panel region of the flexible display panel, that is slid into the housing through the first edge region, into an empty space of the housing and to allow the first panel region of the flexible display panel to move along a first moving path in the empty space of the housing;
a second main roller to guide a second panel region of the flexible display panel, that is slid into the housing through the second edge region, into the empty space of the housing, a radius of rotation of the second main roller equal to a radius of rotation of the first main roller; and
an assistant roller to assist the second main roller to allow the second panel region of the flexible display panel to move along a second moving path that does not intersect the first moving path in the empty space of the housing.

2. The sliding display device as claimed in claim 1, wherein the assistant roller is separate from the second main roller.

3. The sliding display device as claimed in claim 1, wherein a radius of rotation of the assistant roller is different from the radius of rotation of the second main roller.

4. The sliding display device as claimed in claim 1, wherein a radius of rotation of the assistant roller is equal to the radius of rotation of the second main roller.

5. A sliding display device, comprising:
a housing including a display region between a first edge region and a second edge region, a distance between the first edge region and the second edge region to change as the housing is expanded or contracted in a first direction and a second direction opposite to the first direction;
a flexible display panel to slide out from the housing through the first and second edge regions as the housing is expanded and to slide into the housing through the first and second edge regions as the housing is contracted;
a first main roller to guide a first panel region of the flexible display panel, that is slid into the housing through the first edge region, into an empty space of the housing;
a first assistant roller to assist the first main roller to allow the first panel region of the flexible display panel to move along a first moving path in the empty space of the housing;
a second main roller to guide a second panel region of the flexible display panel, that is slid into the housing through the second edge region, into the empty space of the housing, a radius of rotation of the second main roller equal to a radius of rotation of the first main roller; and
a second assistant roller to assist the second main roller to allow the second panel region of the flexible display panel to move along a second moving path that does not intersect the first moving path in the empty space of the housing.

6. The sliding display device as claimed in claim 5, wherein the first assistant roller is separate from the first main roller.

7. The sliding display device as claimed in claim 5, wherein the second assistant roller is separate from the second main roller.

8. The sliding display device as claimed in claim 5, wherein:
a radius of rotation of the first assistant roller is different from the radius of rotation of the first main roller, and
a radius of rotation of the second assistant roller is different from the radius of rotation of the second main roller.

9. The sliding display device as claimed in claim 8, wherein the radius of rotation of the first assistant roller is different from the radius of rotation of the second assistant roller.

10. The sliding display device as claimed in claim 8, wherein the radius of rotation of the first assistant roller is equal to the radius of rotation of the second assistant roller.

11. A sliding display device, comprising:
a housing including a display region between a first edge region and a second edge region, a distance between the first edge region and the second edge region to change as the housing is expanded or contracted in a first direction and a second direction opposite to the first direction;
a flexible display panel to slide out from the housing through the first and second edge regions as the housing is expanded and to slide into the housing through the first and second edge regions as the housing is contracted;
a first main roller to guide a first panel region of the flexible display panel, that is slid into the housing through the first edge region, into an empty space of the housing, and to allow the first panel region of the flexible display panel to move along a first moving path in the empty space of the housing;
a second main roller to guide a second panel region of the flexible display panel, that is slid into the housing through the second edge region, into the empty space of the housing, a radius of rotation of the second main roller equal to a radius of rotation of the first main roller; and
a support beam to support the second panel region of the flexible display panel to allow the second panel region of the flexible display panel to move along a second moving path that does not intersect the first moving path in the empty space of the housing.

12. The sliding display device as claimed in claim 11, wherein the support beam has a cylindrical shape.

13. The sliding display device as claimed in claim 11, wherein the support beam is separate from the second main roller.

14. A sliding display device, comprising:
a housing including a display region between a first edge region and a second edge region, a distance between the first edge region and the second edge region to change as the housing is expanded or contracted in a first direction and a second direction opposite to the first direction;
a flexible display panel to be slide out from the housing through the first and second edge regions as the housing is expanded and to slide into the housing through the first and second edge regions as the housing is contracted;
a first main roller to guide a first panel region of the flexible display panel, that is slid into the housing through the first edge region, into an empty space of the housing;
a first support beam to support the first panel region of the flexible display panel to allow the first panel region of the flexible display panel to move along a first moving path in the empty space of the housing;
a second main roller to guide a second panel region of the flexible display panel, that is slid into the housing through the second edge region, into the empty space of the housing, a radius of rotation of the second main roller equal to a radius of rotation of the first main roller; and
a second support beam to support the second panel region of the flexible display panel to allow the second panel region of the flexible display panel to move along a second moving path that does not intersect the first moving path in the empty space of the housing.

15. The sliding display device as claimed in claim 14, wherein each of the first support beam and the second support beam has a cylindrical shape.

16. The sliding display device as claimed in claim 14, wherein the first support beam is separate from the first main roller.

17. The sliding display device as claimed in claim 14, wherein the second support beam is separate from the second main roller.

18. A sliding display device, comprising:
a housing including a display region between a first edge region and a second edge region, a distance between the first edge region and the second edge region to change as the housing is expanded or contracted in a first direction and a second direction opposite to the first direction;
a flexible display panel to slide out from the housing through the first and second edge regions as the housing is expanded and to slide into the housing through the first and second edge regions as the housing is contracted;
a first support beam to guide a first panel region of the flexible display panel, that is slid into the housing through the first edge region, into an empty space of the housing and to support the first panel region of the flexible display panel to allow the first panel region of the flexible display panel to move along a first moving path in the empty space of the housing, the first support beam having a cylindrical shape with a radius of curvature; and
a second support beam to guide a second panel region of the flexible display panel, that is slid into the housing through the second edge region, into the empty space of the housing and to support the second panel region of the flexible display panel to allow the second panel region of the flexible display panel to move along a second moving path that does not intersect the first moving path in the empty space of the housing, the second support beam having a cylindrical shape with a first radius of curvature in a front direction of the housing and a second radius of curvature in a back direction of the housing,
wherein the radius of curvature of the first support beam is equal to the first radius of curvature of the second support beam, and the first radius of curvature of the second support beam is different from the second radius of curvature of the second support beam.

19. The sliding display device as claimed in claim 18, wherein the first radius of curvature of the second support beam is greater than the second radius of curvature of the second support beam.

20. The sliding display device as claimed in claim 18, wherein the first radius of curvature of the second support beam is less than the second radius of curvature of the second support beam.

* * * * *